(12) United States Patent
Seo et al.

(10) Patent No.: US 6,525,584 B2
(45) Date of Patent: Feb. 25, 2003

(54) DIGITAL PHASE INTERPOLATOR FOR CONTROLLING DELAY TIME AND METHOD THEREOF

(75) Inventors: Il-won Seo, Seoul (KR); Kyu-hyun Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/987,624

(22) Filed: Nov. 15, 2001

(65) Prior Publication Data

US 2003/0006817 A1 Jan. 9, 2003

(30) Foreign Application Priority Data

Jul. 4, 2001 (KR) .......................................... 01-0039759

(51) Int. Cl.[7] .................................................. H03K 5/13
(52) U.S. Cl. ........................ 327/276; 327/281; 327/288
(58) Field of Search ................................ 327/276, 231, 327/235, 237, 239, 242, 250, 252, 258, 261, 264, 270, 278, 281, 285, 288

(56) References Cited

U.S. PATENT DOCUMENTS 3,911,368 A * 10/1975 Tarczy-Hornoch .......... 327/237
5,485,490 A * 1/1996 Leung et al. ................ 375/371
5,554,945 A * 9/1996 Lee et al. .................... 327/105
5,864,246 A * 1/1999 Anderson .................... 327/122
6,111,445 A * 8/2000 Zebre et al. ................. 327/231
6,122,336 A * 9/2000 Anderson .................... 375/371
6,369,661 B1 * 4/2002 Scott et al. .................... 331/45

* cited by examiner

Primary Examiner—Kenneth B. Wells
Assistant Examiner—Hai L. Nguyen
(74) Attorney, Agent, or Firm—Lee & Sterba, P.C.

(57) ABSTRACT

A digital phase interpolator including a plurality of delay stages to control delay time of an output signal from first and second input signals having different phase delays. The plurality of delay stages are connected serially, have a same internal structure, determine corresponding axes for interpolation in each stage, and each includes a first inverting section for inverting first and second signal inputs from the previous stage, a phase blender for blending outputs of the first inverting section, a second inverting section for inverting outputs of the first inverting section, and a multiplexer for generating input signals for the next stage in response to a selection signal for determining phase delay time of the output signal of the phase interpolator. Total area and current may be reduced by the present invention because the number of inverters comprising each stage is equal.

12 Claims, 5 Drawing Sheets

DIGITAL PHASE INTERPOLATOR FOR CONTROLLING DELAY TIME AND METHOD THEREOF

BACKGROUND OF THE INVENTION

1. Field of the Invention

The present invention relates to a semiconductor integrated circuit. More particularly, the present invention relates to a digital phase interpolator for controlling fine delay time of a semiconductor integrated circuit and a method thereof.

2. Description of the Related Art

A semiconductor integrated circuit usually employs a circuit for controlling fine delay time. Often a digital phase interpolator is used to control delay times of internal clock signals in a semiconductor integrated circuit.

FIG. 1 illustrates a circuit diagram of a digital phase interpolator for controlling delay time according to the prior art. The conventional digital phase interpolator is comprised of inverters 100, 105 and first-third delay stages 110, 120, 130. FIG. 1 indicates the digital phase interpolator having 9-minimum delay steps.

Referring to FIG. 1, the inverters 100, 105 invert a first signal (IN1) and a second signal (IN2) respectively, and output inverted signals. First signal (IN1) and second signal (IN2) have different phases. Then, inverters 112, 114 of the first delay stage 110 invert an output signal of the inverter 100, and inverters 116, 118 of the first delay stage 110 invert an output signal of the inverter 105. The inverters 114, 116 blend phases of the first signal (IN1) and the second signal (IN2), generate a phase blending signal having an intermediate phase between the phases of the two signals (IN1, IN2), and apply the phase blending signal to the second delay stage 120.

If the number of minimum delay steps is nine as in the example above, the second delay stage 120 and the third delay stage 130 are comprised of more inverters than those of the first delay stage 110. Thus, the number of output signals of each stage increases compared to that of the previous stage. The number of output signals of the second delay stage 120 is five and the number of output signals of the third delay stage 130 is nine. That is, a total of 24-inverters are required to design a phase interpolator having 9-steps. The number of inverters required for the I-th delay stage (except the first delay stage) may be determined by the equation: $N(I)=2*N(I-1)-1$, where $N(I-1)$ indicates the number of inverters in the previous delay stage.

FIG. 2 illustrates a diagram of a process in which output signals from the circuit shown in FIG. 1 are generated, and the number of output signals generated from each of the delay stages 110–130 increases for each consecutive stage. Referring to FIG. 1 and FIG. 2, one of third delay stage 130 output signals (D1–D9) is selected and becomes an output signal (SOUT).

If minimum delay steps are reduced to obtain high resolution, the number of blocks, such as inverters for phase blending, is increased. Also, because the number of output signals outputted from each delay stage increases as the number of delay stages increases, current dissipation of the total circuit is increased. Moreover, it is difficult to match loading of internal inverters of each delay stage to have linear output characteristics of phase delay control. If loading matching is needed, the number of inverters actually required increases and circuit area may necessarily be increased further. Consequently, current dissipation and the linear output characteristics of a conventional digital phase interpolator are inefficient.

SUMMARY OF THE INVENTION

According to a feature of an embodiment of the present invention, there is provided a digital phase interpolator for controlling delay time in a circuit that is capable of reducing circuit area and current dissipation in an integrated circuit as compared to a conventional digital phase interpolator, and is capable of allowing linear output characteristics by selecting axes for interpolation in advance and transferring the axes to a next stage.

According to another feature of an embodiment of the present invention, there is provided a method for controlling delay time of the digital phase interpolator.

According to a feature of an embodiment of the present invention, a digital phase interpolator is provided which includes a plurality of delay stages to control a delay time of an output signal from a first and a second signal of differing phase delays. The plurality of delay stages are connected serially to each other, have a same internal structure, and determine corresponding axes for interpolation in each stage. Also, each of the plurality of delay stages includes a first inverting section, a phase blender, a second inverting section, and a multiplexer. The first inverting section inverts a first and a second input signal inputted from the previous stage. The phase blender generates a phase blending signal by phase blending output signals of the first inverting section. The second inverting section inverts the output signals of the first inverting section. The multiplexer generates input signals for a next stage by determining one of output signals outputted from the second inverting section and the phase blending signal as axes for interpolation in response to a selection signal for determining phase delay time of an output signal of the digital phase interpolator.

According to another feature of an embodiment of the present invention, a method for controlling a delay time of an output signal of a phase interpolator having a plurality of delay stages connected serially to each other and having a same internal structure for interpolation of a first and a second signal having different phase delays is provided which includes generating a plurality of phase blending signals corresponding to each delay stage by phase blending an output signal resulting from a first and a second input signal inputted to each of the plurality of delay stages, generating a selection signal for phase determination by making a phase comparison between the output signal of the phase interpolator and a reference clock signal, transferring input signals for a next stage by determining one of the first and second input signals corresponding to each of the plurality of delay stages and each of the plurality of phase blending signals as axes for interpolation in response to the selection signal, generating one of two signals outputted from a last delay stage as the output signal of the phase interpolator when stage operations for final phase determination are completed, and repeating the process until the stage operations for final phase determination are completed.

Thus, although the number of stages according to minimum delay stages required for desired interpolation is increased, area and current dissipation of the total circuit may be reduced because there are an equal number of inverters comprising each stage. Also, because it is easy to match the loading of the inverters comprising each stage, a linear output characteristic may be obtained regardless of an increase of the number of delay stages.

These and other features and aspects of the present invention will be readily apparent to those of ordinary skill in the art upon review of the detailed description that follows.

DETAILED DESCRIPTION OF THE PREFERRED EMBODIMENTS

Korean Patent Application No. 2001-39759, filed on Jul. 4, 2001, and entitled: "Digital Phase Interpolator for Controlling Delay Time and Method Thereof," is incorporated by reference herein in its entirety.

The present invention will be described more fully hereinafter with reference to the accompanying drawings, in which preferred embodiments of the present invention are shown. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1:
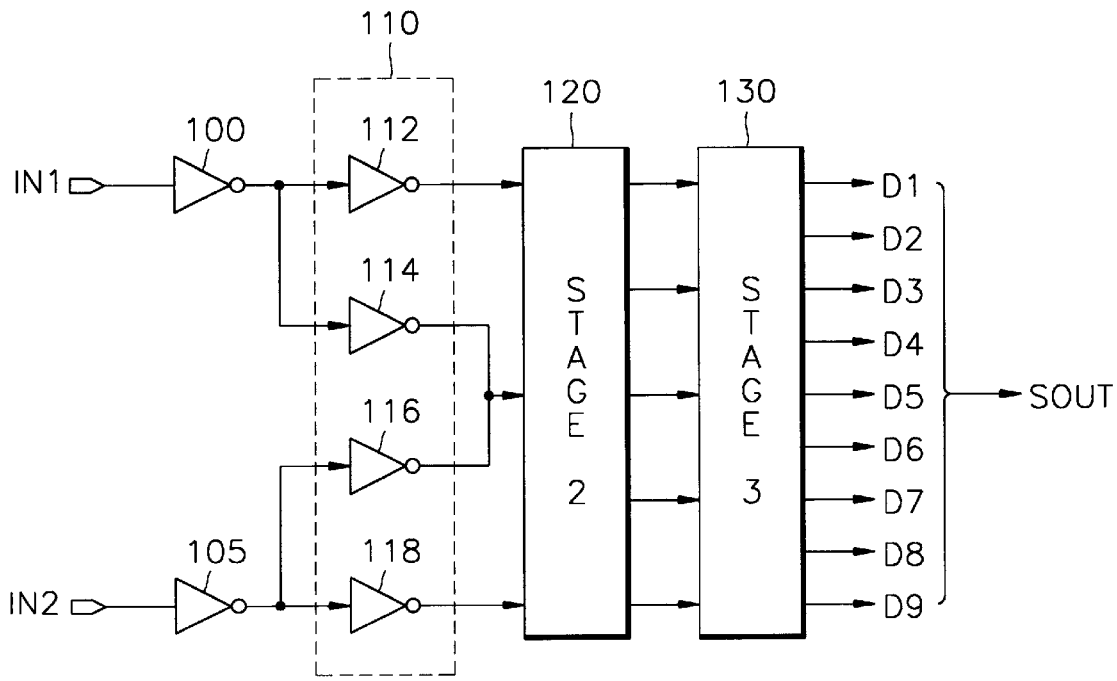
FIG. 1 illustrates a circuit diagram of an embodiment of a phase interpolator according to the prior art.
Figure 2:
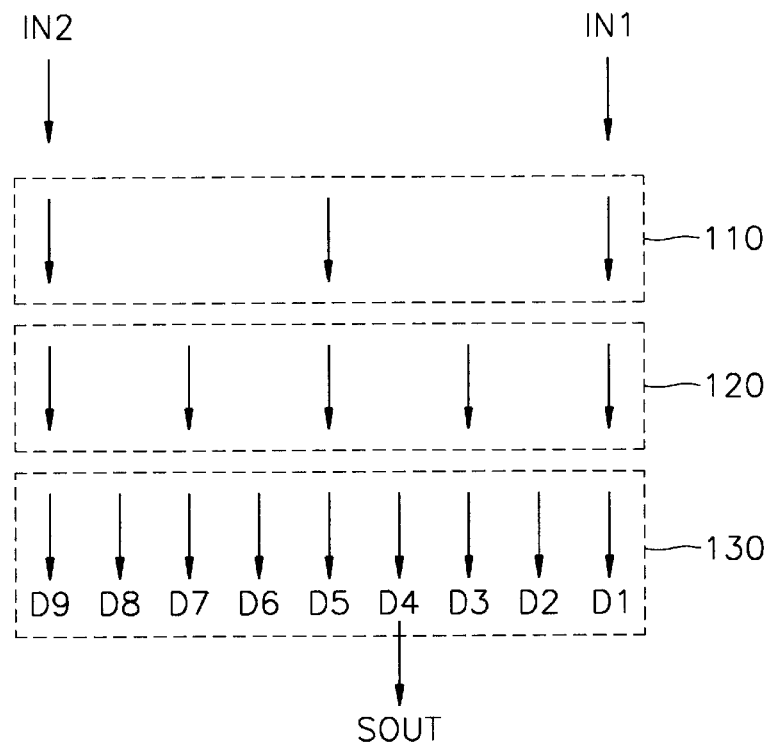
FIG. 2 illustrates a diagram of a process in which output signals from the circuit shown in FIG. 1 are generated.
Figure 3:
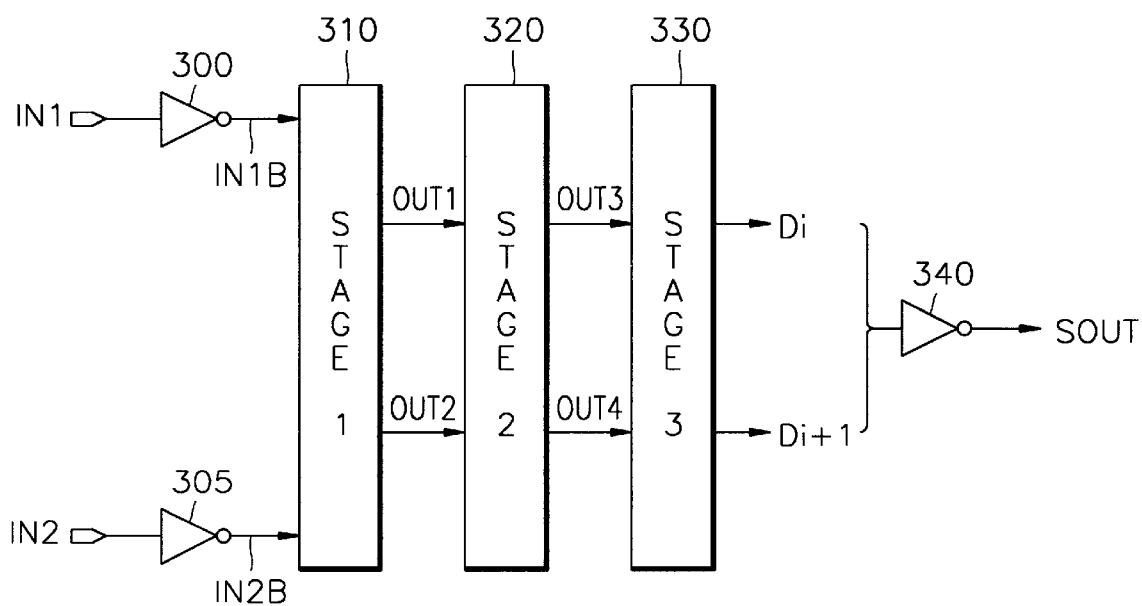
FIG. 3 illustrates a block diagram of a digital phase interpolator for controlling delay time according to an embodiment of the present invention.

Referring to FIG. 3, a digital phase interpolator includes inverters 300, 305 and first-third delay stages 310–330 connected serially to each other and having a same internal structure.

The inverters 300, 305 act as inverting buffers inverting a first signal (IN1) and a second signal (IN2) respectively, and output inverted signals as IN1B and IN2B respectively. Herein, the first signal (IN1) and the second signal (IN2) have different delay times, and may be obtained by delaying, for example, a reference clock signal (not shown). Also, if minimum delay steps that can be embodied in the digital phase interpolator according to an embodiment of the present invention are N-steps, the intervals between the first signal (IN1) and the second signal (IN2) are divided into N-steps.

The first delay stage 310 receives the signals (IN1B, IN2B) outputted from the inverters 300, 305, and generates a first phase blending signal (not shown) internally by the signals (IN1B, IN2B). Also, the first delay stage 310 generates output signals (OUT1, OUT2) by determining the first phase blending signal and a selected signal between the signals (IN1B, IN2B) as axes for interpolation.

The second delay stage 320 receives signals (OUT1, OUT2) outputted from the first delay stage 310 as a first input signal and a second input signal, respectively, and generates a second phase blending signal (not shown) from the input signals (OUT1, OUT2). Also, the second delay stage 320 generates output signals (OUT3, OUT4) by determining the second phase blending signal and a selected signal between the input signals (OUT1, OUT2) as axes for interpolation.

The third delay stage 330 receives signals (OUT3, OUT4) outputted from the second delay stage 320 as a first input signal and a second input signal, respectively, and generates a third phase blending signal (not shown) from the input signals (OUT3, OUT4). Also, the third delay stage 330 generates output signals by determining the third phase blending signal and a selected signal between the input signals (OUT3, OUT4) as axes for interpolation. Herein, the output signals of the third delay stage 330 are indicated as Di and Di+1. That is, assuming that minimum delay steps are 9-steps as in an embodiment of the present invention, and signals corresponding to each step are D1–D9, the output signals (Di, Di+1) of the third delay stage 330 become two consecutive signals among D1–D9. For instance, if Di is D3, Di+1 may be D4.

The detailed configurations of the first-third delay stages 310–330 will be explained with reference to FIG. 5. One of the two output signals from the third delay stage 330, which may be input to inverting buffer 340, becomes an actual delay output signal (SOUT) of the digital phase interpolator. FIG. 3 illustrates an embodiment having 9-minimum delay steps, and the number of stages may be changed according to the number of minimum delay steps.

Figure 4:
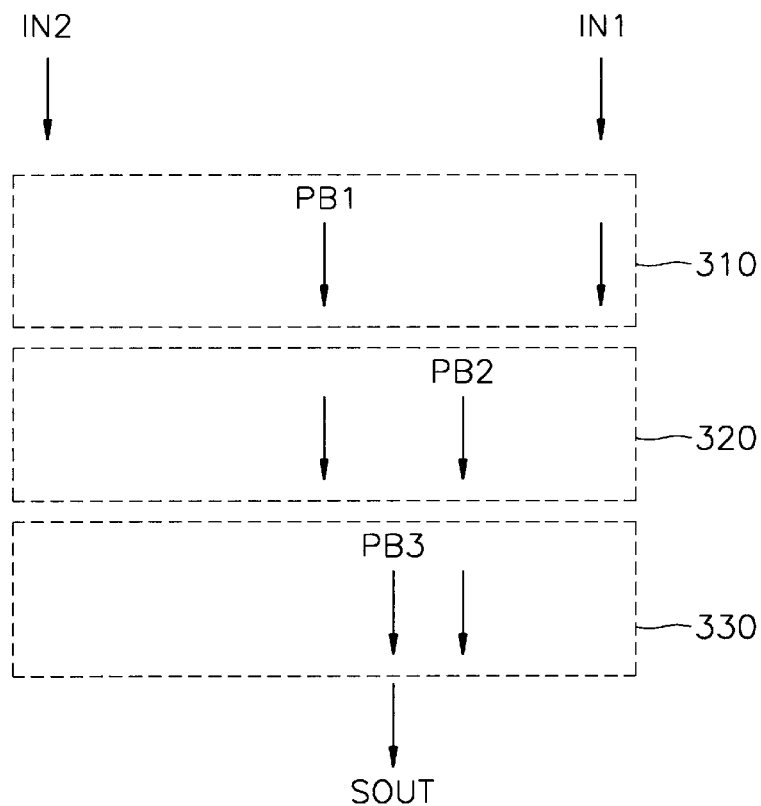
FIG. 4 illustrates a diagram of a process in which output signals from the circuit shown in FIG. 3 are generated.

Referring to FIG. 4, two signals are outputted from each stage. Output signals of each stage include phase blending signals (PB1–PB3) between two signals outputted from a previous stage and one of the two signals outputted from a previous stage. The first phase blending signal (PB1) generated from the first delay stage 310 has an intermediate phase between the two signals (IN1, IN2), and the second phase blending signal (PB2) has an intermediate phase between the input signals (OUT1, OUT2) of the second delay stage 320. Similarly, the third blending signal (PB3) has an intermediate phase between the input signals (OUT3, OUT4) of the third delay stage. In FIG. 4, final output signal (SOUT) is D4.

Figure 5:
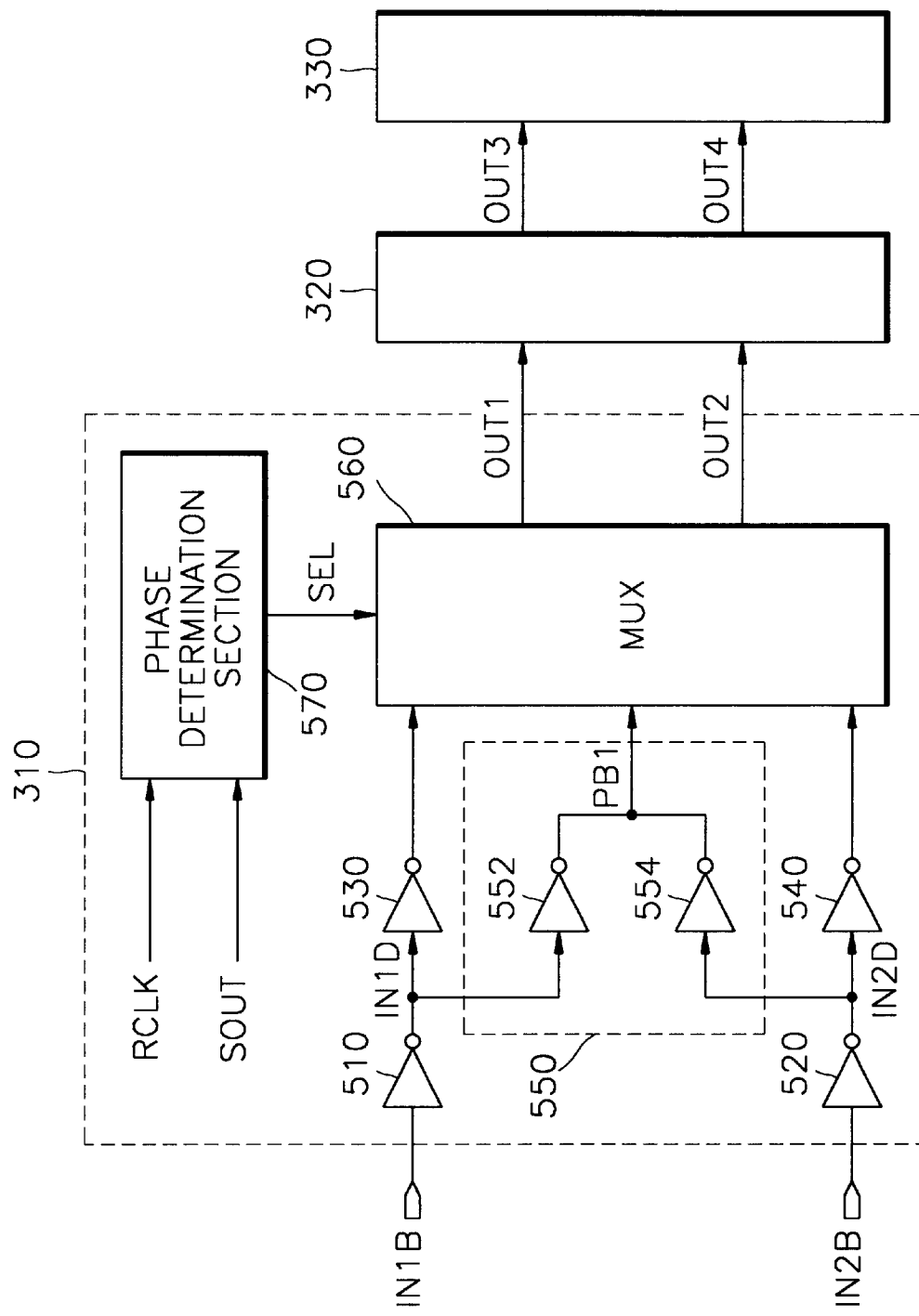
FIG. 5 illustrates a detailed circuit diagram of each stage of the circuit shown in FIG. 3.

Referring to FIG. 5, the first delay stage 310 includes inverters 510, 520, inverters 530, 540, a phase blender 550, a multiplexer 560, and a phase determination section 570.

The inverters 510,520 invert the signals (IN1B, IN2B) respectively outputted from the inverting buffers 300, 305 of FIG. 3, and output inverted signals as IN1D and IN2D respectively. Herein, the inverters 510,520 may be referred to as a first inverting section. The inverters 530, 540 invert output signals of the inverters 510, 520 respectively. Herein, the inverters 530, 540 may be referred to as a second inverting section.

The phase blender 550 receives the output signals (IN1D, IN2D) of the inverters 510, 520 comprising the first inverting section, and generates the first phase blending signal (PB1) having an intermediate phase between the output signals (IN1D, IN2D). For this function, the phase blender 550 includes inverters 552, 554 having outputs connected to each other. The output level of the first phase blending signal (PB1) outputted from the phase blender 550 is not set to only high or low level, but may be set to a voltage level between high level (for example, a power supply voltage) and low level (for example, a ground voltage) according to the condition of input signals (IN1D, IN2D). The detailed configuration and operation of the phase blender 550 will be explained with reference to FIG. 6 and FIG. 7.

The phase determination section 570 makes phase comparison between a reference clock signal (RCLK) and the delayed output signal (SOUT) outputted from a final stage, i.e., the third delay stage 330, and generates a selection signal (SEL) for determining the phase delay of the output signal (SOUT) by the compared result. For this function, the phase determination section 570 may be controlled by a state machine (not shown) or a shift register (not shown) provided to the external of each of the delay stages. Alternatively, the state machine or the shift register may be provided to the internal of the phase determination section 570. The state machine stores phase state of each of input signals inputted to the delay stages 310–330 and each of the first-third phase blending signals (PB1, PB2, PB3). Thus, the state machine selects corresponding signals according to the result of phase comparison between the delayed output signal (SOUT) and the reference clock signal (RCLK). Also, if the shift register is provided to the internal of the phase determination section 570, the shift register stores phase state of each of input signals inputted to the delay stages 310-330 and each of the first-third phase blending signals (PB1, PB2, PB3) as a code. Thus, the shift register controls the code to select corresponding signals in response to the result of phase comparison between the delayed output signal (SOUT) and the reference clock signal (RCLK).

As another example, the phase determination section 570 is not provided to each delay stage, but only one phase determination section may be provided to the external of the delay stages to generate the selection signal (SEL). At this time, the generated selection signal (SEL) is applied to multiplexers of each of the delay stages 310–330.

The multiplexer 560 generates the output signals (OUT1, OUT2) by determining one of signals outputted from the inverters 530, 540 and the first phase blending signal (PB1) as axes for interpolation in response to the selection signal (SEL).

The second and third delay stages 320, 330 have the same configuration as the first delay stage even though not specifically shown. Because there are an equal number of inverters used in each of the delay stages 310–330, specifically six, total circuit area may be reduced and current consumption may also be reduced by making each output path identical. Also, because all delay stages are connected and of the same structure, it is easy to match the loading of each inverter.

Figure 6:
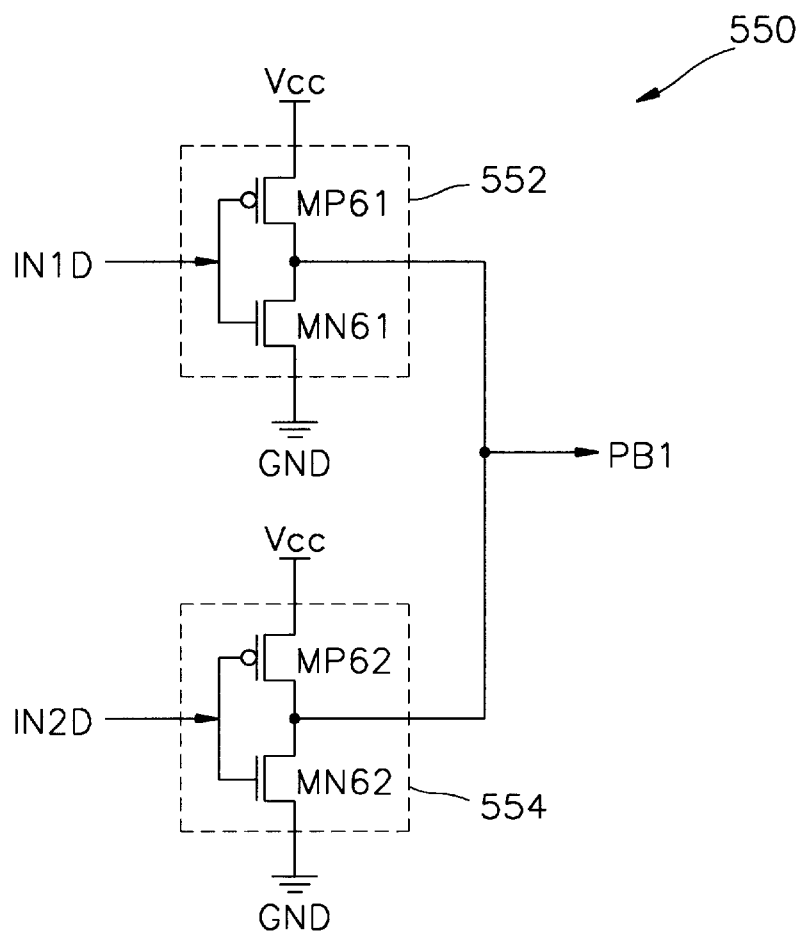
FIG. 6 illustrates a detailed circuit diagram of a phase blender in each stage of the circuit shown in FIG. 3.

Referring to FIG. 6, an inverter 552 is comprised of serially connected PMOS transistor (MP61) and NMOS transistor (MN61), and an inverter (554) is comprised of serially connected PMOS transistor (MP62) and NMOS transistor (MN62). Sources of the PMOS transistors (MP61, MP62) are connected to a power supply voltage (VCC), and sources of the NMOS transistors (MN61, MN62) are connected to a ground voltage (GND). Also, gates of the PMOS transistor (MP61) and the NMOS transistor (MN61) are connected to the input signal (IN1D), and gates of the PMOS transistor (MP62) and the NMOS transistor (MN62) are connected to the input signal (IN2D).

Figure 7:
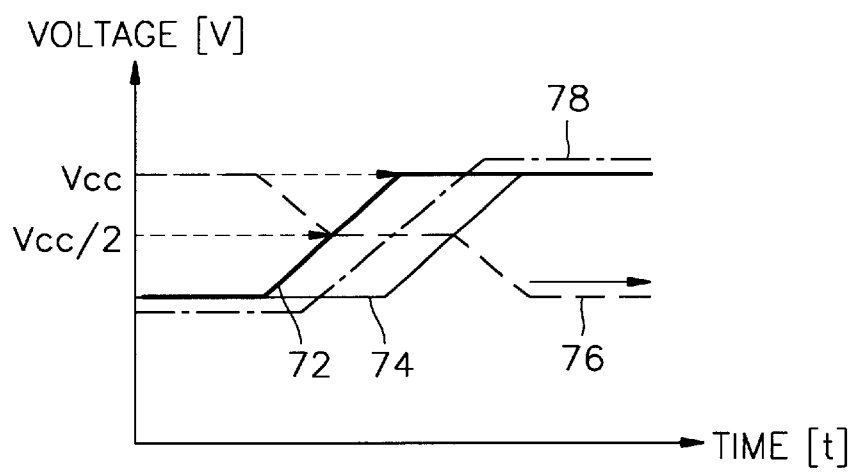
FIG. 7 illustrates a waveform diagram of input and output signals of the circuit shown in FIG. 6.

Referring to FIG. 7, reference numbers 72 and 74 indicate the input signals (IN1D, IN2D) of FIG. 6 respectively, reference number 76 indicates the first phase blending signal (PB1) of FIG. 6, and reference number 78 indicates a signal obtained by inverting the first phase blending signal (PB1) through the multiplexer 560 of FIG. 5.

With reference to FIGS. 6–7, the explanation of the operation of the first phase blender 550 shown in FIG. 6 is as follows. First, when both of the input signals (IN1D, IN2D) are low level, the PMOS transistor (MP61) of the inverter 552 and the PMOS transistor (MP62) of the inverter 554 become turned-on, and the first phase blending signal (PB1) maintains high level as shown in FIG. 7. At this time, if the signal (IN1D) transitions to a high level from the previous low level, the NMOS transistor (MN61) of the inverter 552 becomes turned-on and potential level of the first phase blending signal (PB1) becomes low. Because the signal (IN2D) does not become high level at this time, the PMOS transistor (MP62) remains in the turned-on state. Thus, the potential level of the first phase blending signal (PB1) is determined by the turned-on resistor values of the PMOS transistor (MP62) and the NMOS transistor (MN61). If the turned-on resistor values of the PMOS transistor (MP62) and the NMOS transistor (MN61) are identical, the potential level of the first phase blending signal (PB1, 76) may become VCC/2. Then, if the signal (IN2D) transitions to high level from the previous low level, the first phase blending signal (PB1, 76) becomes full low level. Thus, it can be understood that a signal (78) inverted from the first phase blending signal (PB1) becomes a signal having an intermediate phase between the two signals (IN1D, IN2D).

In FIG. 7, when the phase difference between the input signals (IN1D, IN2D) signal (78) is large is indicated. However, the first phase blending signal (PB1, 76) can have a smooth transition shape when the phase difference between the two input signals is small and the slopes of the two input signals are large.

Figure 8:
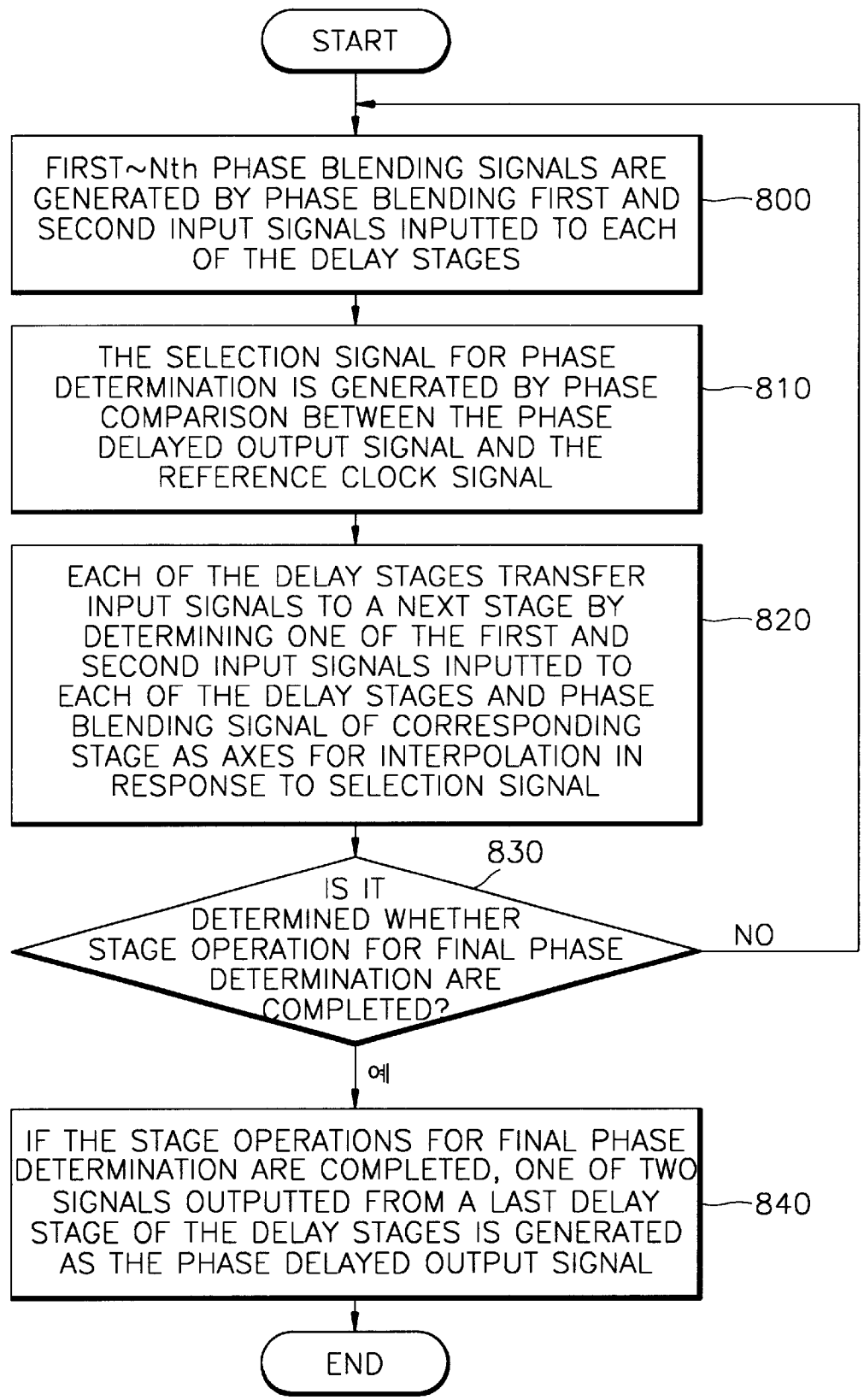
FIG. 8 illustrates a flowchart of a method for controlling delay time of the digital phase interpolator shown in FIG. 3.

FIG. 8 illustrates a flowchart of a method for controlling delay time of the digital phase interpolator according to an embodiment of the present invention.

The method for controlling delay time of the digital phase interpolator according to the present invention will be explained in more detail with reference to FIG. 3–FIG. 8. First, first –N-th phase blending signals (N is 3 in this embodiment) are generated by phase blending first and second input signals inputted to each of the delay stages 310–330 (Step 800). Input signals of the first delay stage 310 are the signals (IN1B, IN2B) of FIG. 5, and input signals of the second delay stage 320 are the signals (OUT1, OUT2). For example, the first delay stage 310 receives the input signals (IN1B, IN2B) and generates the first phase blending signals (PB1) by phase blending of the two input signals. Also, the second and third delay stages 320, 330 generate the second and third phase blending signals (PB2, PB3) respectively. At this time, the selection signal (SEL) for phase determination is generated by phase comparison between the phase delayed output signal (SOUT) and the reference clock signal (RCLK) (Step 810).

Each of the delay stages 310–330 transfers input signals for a next stage by determining one of the two input signals inputted to each of the delay stages 310–330 and the phase blending signal of corresponding stage as axes for interpolation in response to the selection signal (SEL) (Step 820). At this time, it is determined whether stage operations for final phase determination are completed (Step 830). If the stage operations for final phase determination are not completed, steps 800–830 are repeated. If the stage operations for final phase determination are completed on the contrary, one of two signals outputted from a last delay stage of the delay stages is generated as the phase delayed output signal (SOUT) (Step 840).

According to an embodiment of the present invention, each delay stage connected serially may be set to have a same output signal path regardless of the number of minimum delay steps because each delay stage transfers only one phase blending signal having an intermediate phase between input signals to the next delay stage.

According to an embodiment of the present invention, although the number of stages according to minimum delay stages required for desired interpolation is increased, area and current dissipation of the total circuit can be reduced because the number of inverters comprising each stage is equal.

Also, because it is easy to match the loading of inverters comprising each stage, the linear output characteristic may be obtained regardless of an increase in the number of delay stages.

A preferred embodiment of the present invention has been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A phase interpolator for controlling a delay time of an output signal from a first and a second signal having different phase delays comprising:

a plurality of delay stages connected serially to each other and having a same internal structure, for determining corresponding axes for interpolation in each stage, wherein each of the plurality of delay stages comprises:

a first inverting section for inverting a first input signal and a second input signal inputted from a previous stage and thereafter outputting a first output signal and a second output signal;

a phase blender for generating a phase blending signal by phase blending the first and second output signals of the first inverting section;

a second inverting section for inverting the first and second output signals of the first inverting section and outputting a third output signal and a fourth output signal; and a multiplexer for generating a fifth output signal and a sixth output signal for determining phase delay time of the output signal of the phase interpolator by selecting one of the third and fourth output signals and the phase blending signal as axes for interpolation in response to a select signal, wherein the fifth and sixth output signals are input signals for a next stage, and wherein one of the fifth and sixth output signals outputted from the multiplexer of a last delay stage is used as the output signal of the phase interpolator.

2. The phase interpolator as claimed in claim 1, wherein the phase blender comprises inverters having outputs connected to each other for inverting the output signals of the first inverting section, and the phase blending signal is set to have an intermediate phase between the first and second input signals.

3. The phase interpolator as claimed in claim 1, wherein each of the plurality of delay stages further comprises a phase determination section for generating the selection signal by making a phase comparison between the output signal of the phase interpolator and a reference clock signal.

4. The phase interpolator as claimed in claim 3, wherein the phase determination section comprises a state machine for storing phase state of the first and second input signals and the phase blending signal, and generates the selection signal to select corresponding signals by making a phase comparison between the output signal of the phase interpolator and the reference clock signal.

5. The phase interpolator as claimed in claim 3, wherein the phase determination section comprises a shift register for storing phase state of the first and second input signals and the phase blending signal as a code, and controls the code to select corresponding signals by making a phase comparison between the output signal of the phase interpolator and the reference clock signal.

6. The phase interpolator as claimed in claim 3, wherein the phase interpolator further comprises a state machine for storing phase state of each of the first and second input signals and each of the phase blending signals of the plurality of delay stages, and the phase determination section is controlled by the state machine.

7. The phase interpolator as claimed in claim 3, wherein the phase interpolator further comprises a shift register for storing phase state of each of the first and second input signals and each of the phase blending signals of the plurality of delay stages, and the phase determination section is controlled by the shift register.

8. The phase interpolator as claimed in claim 1, wherein the phase interpolator further comprises a phase determination section for generating the selection signal by making a phase comparison between the output signal of the phase interpolator and a reference clock signal, and for applying the selection signal to each multiplexer of the plurality of delay stages.

9. The phase interpolator as claimed in claim 1, wherein the phase interpolator further comprises a first inverting buffer for inverting the first and second signals, and applying output signals of the first inverting section as the first and second input signals of a first delay stage.

10. The phase interpolator as claimed in claim 9, wherein the phase interpolator further comprises a second inverting buffer for inverting one of the fifth and sixth output signals outputted from the multiplexer of the last delay stage, and for generating the output signal of the phase interpolator.

11. A method for controlling a delay time of an output signal of a phase interpolator having a plurality of delay stages connected serially to each other and having a same internal structure, for interpolation of a first and a second input signal of differing phase delays, comprising the steps of:

A. generating a plurality of phase blending signals corresponding to each delay stage by phase blending of a first and a second input signal inputted to each of the plurality of delay stages;

B. generating a selection signal for phase determination by making phase comparison between the output signal of the phase interpolator and a reference clock signal;

C. transferring input signals for a next stage by determining one of the first and second input signals corresponding to each of the plurality of delay stages and each of the plurality of phase blending signals as axes for interpolation in response to the selection signal; and D. generating one of two signals outputted from a last delay stage as the output signal of the phase interpolator when stage operations for final phase determination are completed; and repeating steps A–D when the stage operations for final phase determination are not completed.

12. The method as claimed in claim 11, wherein in step A, the phase blending signals have an intermediate phase between the first and second input signals inputted to each of the plurality of delay stages.

* * * * *